United States Patent [19]

Wronski et al.

[11] 4,266,984

[45] May 12, 1981

[54] ENHANCED OPEN CIRCUIT VOLTAGE IN AMORPHOUS SILICON PHOTOVOLTAIC DEVICES

[75] Inventors: Christopher R. Wronski, Princeton; Bruce P. Myers, Garwood, both of N.J.

[73] Assignee: Exxon Research and Engineering Company, Florham Park, N.J.

[21] Appl. No.: 99,421

[22] Filed: Dec. 3, 1979

[51] Int. Cl.$^3$ .......................................... H01L 31/04
[52] U.S. Cl. .................................. 136/255; 136/258; 148/1.5; 357/2; 357/15; 357/30; 427/74; 427/84; 427/86
[58] Field of Search ................. 357/2, 15, 30; 427/74, 427/82, 84, 86; 148/1.5; 136/258, 255

[56] References Cited

U.S. PATENT DOCUMENTS 4,064,521  12/1977  Carlson ................................. 357/2

OTHER PUBLICATIONS

D. E. Carlson, "Amorphous Silicon Solar Cells", *IEEE Trans. Electron Devices*, vol. ED-24, Apr. 1977, pp. 449-453.
D. E. Carlson, "The Effects of Impurities & Temperature on Amorphous Silicon Solar Cells, "*1977 Int'l Electronics & Devices Meeting*, Wash. D.C., pp. 214-217.

*Primary Examiner*—Aaron Weisstuch
*Attorney, Agent, or Firm*—Paul E. Purwin

[57] ABSTRACT

An amorphous silicon photovoltaic device having enhanced photovoltage and increased longevity is produced by treatment of a barrier forming region of the amorphous silicon in the presence of a partial pressure of sulfur dioxide.

8 Claims, 2 Drawing Figures

ENHANCED OPEN CIRCUIT VOLTAGE IN AMORPHOUS SILICON PHOTOVOLTAIC DEVICES

FIELD OF THE INVENTION

The present invention relates to amorphous silicon semiconductors and more particularly to an enhanced voltage amorphous silicon photovoltaic device having a junction region altered by exposure to partial pressures of oxygen and sulfur to increase the photovoltage producing capability of the device.

BACKGROUND OF THE INVENTION

The vast majority of photovoltaic devices utilize a body of crystalline material such as silicon for example. The high cost of producing and processing crystalline material has prompted research in providing alternative semiconductor materials. A promising alternative is amorphous silicon which may be utilized in a thin film form (less than 10 microns) to provide high efficiency, low cost solar cells.

PRIOR ART

Thin films of photoconductive amorphous silicon are typically fabricated by either decomposition of silane or sputtering in the presence of hydrogen. Both techniques are known to produce photoconductive amorphous silicon. Conventional junction forming techniques have been utilized to produce photovoltaic devices. For example, Carlson in U.S. Pat. No. 4,064,521 sets forth several alternative solar cell embodiments employing Schottky junctions, P-N junctions and P-I-N junctions. The two principal deficiencies of these devices have been a generally low sunlight conversion efficiency and a deterioration of fundamental properties with time. Conventional applications require an improved efficiency over the existing art and a substantial improvement in the permanence of the device's electrical parameters. The present invention provides means for accomplishing these objectives by way of altering the amorphous silicon semiconductor in the vicinity of the semiconductor junction to both increase the efficiency of the device and improve the longevity of the device's photovoltaic characteristics.

Numerous processing techniques have been demonstrated to effect the photovoltaic properties of amorphous silicon. For example, in a publication entitled *Amorphous Silicon Solar Cells,* IEEE Transactions on Electron Devices, Vol. Ed-24, No. 4, April 1977, Carlson discloses that the deposition of a platinum Schottky electrode in a partial atmosphere of oxygen increases the open circuit voltage by approximately 50–100 mV. However, as noted by Carlson and others in the art, this oxidation technique detrimentally effects other device characteristics. Furthermore, the high voltage and correspondingly the high efficiency of these devices are known to deteriorate with time. In the present invention, the junction forming region is treated with a combined partial pressure of oxygen and sulfur to substantially increase the open circuit voltage of the amorphous silicon photovoltaic device while maintaining or improving the fill factor and the short circuit current. The altered semiconductor additionally displays a substantially enhanced longevity of its fundamental electrical properties under conventional operating conditions.

SUMMARY OF THE INVENTION

An enhanced photovoltage amorphous silicon photovoltaic device is produced by exposing the junction forming region of photoconductive amorphous silicon to a combined partial pressure of oxygen and sulfur. The exposure treatment is believed to alter the amorphous silicon semiconductor in the barrier or depletion region, changing the position of the fermi level relative to untreated amorphous silicon. The devices so produced exhibit substantially increased photovoltages and longevity.

DETAILED DESCRIPTION OF THE INVENTION

Figure 1:
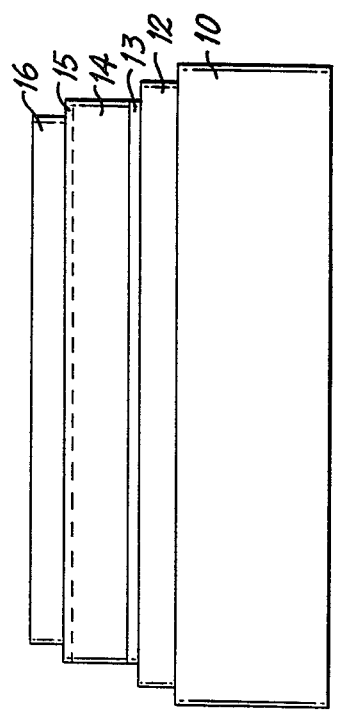
FIG. 1 is a cross-sectional view of the photovoltaic device of the present invention.

Referring to the drawing, there is shown an amorphous silicon photovoltaic device, which in one embodiment comprises a Schottky junction diode. The device is constructed by selecting a substrate 10, materially suitable to the deposition of overlying layers discussed hereinafter. Accordingly, substrate 10 should be capable of withstanding processing temperatures in excess of about 250°–350° C. Additionally, the surface of substrate 10 should preferably be free of protrusions of the order of the intended thickness of the silicon layer in order to avoid discontinuities in the overlying thin films.

In one embodiment, substrate 10 may comprise a material which forms an ohmic contact to amorphous silicon. Alternatively, substrate 10 may comprise any material satisfying the previously described material considerations and may be coated with a layer 12, comprising an ohmic forming electrode such as antimony for example. In a preferred embodiment, the ohmic contact comprises a material known to form an ohmic contact to N+ doped amorphous silicon.

As noted earlier, the deposition of photoconductive amorphous silicon is generally known in the art. Alternative techniques such as glow discharge decomposition of silane or sputtering from a silicon containing target in the presence of a partial pressure of hydrogen are known to produce photoconductive hydrogenated amorphous silicon, generally characterizable as having an intrinsic dark bulk conductivity of between about $10^{+10}$ Ω-cm and about $10^{+5}$ Ω-cm and an illuminated conductivity $\gtrsim 10^{+4}$ Ω-cm when irradiated with 100 mW of white light.

In one embodiment of the present invention, silicon layer 14 is deposited by means of a radio frequency (hereinafter "RF") sustained glow discharge decomposition of silane ($SiH_4$). An initial region 13 contiguous to the ohmic electrode, may preferably be doped N+ to insure the ohmicity of the contacting electrode. The addition of a partial pressure of phosphine gas ranging from about 0.3% to about 3.0% will dope the deposition of amorphous silicon N+. This initial region 13 may extend for between about 100 Å and 5000 Å, after which the dopant gas is deleted and the deposition proceeds with the decomposition of pure silane to produce intrinsic amorphous silicon layer 14.

Typically, the deposition parameters for the glow discharge decomposition of silane include providing a vacuum chamber evacuated to a pressure below about $10^{-5}$ torr. A partial pressure of silane, $SiH_4$, ranging from about 10 mtorr to about 60 mtorr backfills the evacuated chamber, whereafter the partial pressure of silane is maintained by controlling the input flow rate of silane between about 3 cc/min and about 20 cc/min while concurrently throttling the pumping speed of the evacuating system. An RF power supply is capacitively coupled to the gas content of the vacuum chamber by appropriately spaced parallel plate electrodes. This well known technique of coupling RF energy to an ionizable gas media is utilized to decompose the silane, depositing an amorphous silicon film containing hydrogen. As known in the art, the substrate may either be held contiguous to, or be in the vicinity of the anode electrode. Also known to those of the art is the requirement that the substrate be heated during the deposition. Typically the temperature of the substrate will be maintained at a temperature between about 240° C. and about 400° C., dependent upon the accompanying deposition parameters. At an RF frequency of about 13.56 MHz and an input power level ranging from about 20 watts to about 200 watts for 5" and 8" diameter plates, a film thickness between about 0.5 microns and about 2 microns may be deposited between about 20 minutes and about 90 minutes.

A substantially similar technique for glow discharge decomposition of silane substitutes a DC power source for the discharge sustaining power supply. The substrate to be coated is held contiguous the anode electrode which is sustained at a temperature of between about 200° C. to about 400° C. The DC power source supplies a potential of between about 500 volts and 1000 volts between the anode and cathode electrodes. A partial pressure of silane is maintained between about 0.5 torr and about 1.0 torr by the above-described technique. These deposition parameters typically produce an amorphous silicon film ranging in thickness from about 0.5 microns to about 2 microns in a time period of between about 20 minutes and about 90 minutes.

A further alternative for depositing amorphous silicon is sputtering in the presence of a partial pressure of hydrogen.

Typical deposition parameters include providing a partial pressure of about 0.7 millitorr of hydrogen along with a partial pressure of argon about equal to 15 millitorr. Conventional sputtering at a power density of about 2 watts/cm² from a silicon target onto a substrate heated to about 275° C. will provide a deposition rate of about 3 Å/second. For the purposes of the present invention, the resultant amorphous silicon film is substantially similar in photoconductive characteristics to films produced by decomposition of silane.

As discussed earlier, the above-described deposition techniques for producing thin film photoconductive amorphous silicon are generally known in the art. The deposition parameters set forth herein illustrate several of the various deposition techniques known to produce photoconductive silicon.

The intrinsic amorphous silicon layer 14 is then exposed to an ambient containing partial pressures of oxygen and sulfur, during which exposure the surface region of the silicon layer, which will form the junction to an overlying layer, is favorably altered to both enhance the photovoltage producing capability of the device and increase the device longevity. Accordingly, substrate 10 having silicon layer 14 deposited thereon is placed in a controlled ambient container. In one embodiment layer 14 is exposed to an ambient containing a partial pressure of sulfur ranging from about 0.3% to about 2% in combination with a partial pressure of oxygen ranging from about 1% to about 6%. An inert carrier gas such as argon constitutes the remaining partial pressure of gas. Although an atmospheric pressure of sulfur and oxygen has been demonstrated as sufficient in the practice of the present invention, increased pressures may be employed to advantage with corresponding adjustments in the duration and temperature of exposure. The duration of exposure at approximately 23° C., hereinafter "room temperature", ranges from about 4 hours to about 10 hours. The exposure treatment may be accelerated by heating the amorphous silicon layer. Temperatures in excess of room temperature and less than about 100° C. have been demonstrated to accelerate the exposure treatment, reducing the duration of treatment to as little as ½ hour. Temperatures in excess of 100° C. and as high as 300° C. have been shown as operative but demonstrate no detectable advantage relative to the lower temperature (23°–100° C.) treatment.

In a preferred embodiment, a 1.0 micron amorphous silicon film produced by glow discharge decomposition of silane is exposed to a partial pressure of $SO_2$ in argon at a temperature of about 100° C. and for a time period of about two hours. The gaseous $SO_2$ constitutes between 1% and 5% of the total gas content which is maintained in an ambient isolating chamber at slightly above atmospheric pressure.

The exposure treatment is presently understood to alter a region contiguous to the surface of the silicon layer, here illustrated in phantom at 15, changing the position of the fermi-level of the material in this region relative to the fermi-level positon of intrinsic amorphous silicon, resulting in the increased photovoltage taught by the present invention.

Subsequent to the exposure treatment, the amorphous silicon film is subjected to a barrier or junction forming process to provide a barrier-forming layer, here illustrated at 16.

In a preferred embodiment, a semi-transparent layer of palladium is vacuum deposited by conventional resistance heating vapor deposition to form a Schottky junction to the contiguous altered silicon layer. Alternate junction forming techniques, known to those of the art, may also be utilized to produce the enhanced photovoltage device of the present invention. For example, a layer of boron doped P-type amorphous silicon may be used instead of N-type or undoped amorphous silicon and the surface altered so as to give high Voc with low work function metals such as aluminum and chromium.

The photovoltaic device produced in accordance with the present invention has been demonstrated to increase the open circuit photovoltage in excess of about 90% of a substantially identically prepared, unaltered, amorphous silicon photovoltaic device.

To assit one skilled in the art with the practice of this invention, here following are detailed examples of specific embodiments of the present invention:

EXAMPLE 1

A plurality of glass substrates, having a major surface virtually free of protrusions of the order of 1 micron or greater, was scrupulously cleaned to remove debris or other foreign matter. The substrates were transferred to a conventional evaporating system where their major surfaces were coated with about a 1000 Å layer of nichrome, a metal known to form an ohmic contact to N+ doped amorphous silicon. The coated substrates were transferred to a vacuum deposition chamber adapted to provide glow discharge decomposition of silane to deposit photoconductive amorphous silicon. The deposition apparatus included a pyrex bell jar about 30 cm high and about 15 cm in diameter held in vacuum contact to a stainless stell baseplate. A pumping station comprising selectably alternative pumping means of the mechanical pumping and diffusion pumping types is utilized to evacuate the deposition chamber to pressures below about $10^{-5}$ torr. Pumping speed is controlled by selectively varying the opening and closing of an aperature between the pumping station and the deposition chamber. An anode electrode comprising a 7.6 cm diameter circular disk of stainless steel, contained a plurality of electro-resistive heating elements embedded within the electrode. The heaters were connected to a conventional temperature controller, capable of maintaining a relatively constant ($\pm 2°$ C.) temperature of the electrode. The substrates may be secured to the heater/anode electrode by simple mechanical means so long as electrical contact is assured between the anode electrode and the electrodes on the substrate. A second electrode, the cathode electrode, of similar size and composition was positioned parallel to the anode electrode and had an inter-electrode spacing of about 2.54 cm. After evacuating the deposition chamber to high vacuum ($10^{-5}$ torr or greater), high purity argon was bled into the chamber, back-filling the chamber to just below atmospheric pressure. The process of evacuating, backfilling with inert gas and re-evacuating may be repeated to insure the removal of residual atmospheric gases. Gaseous silane, $SiH_4$ containing about 0.3% phosphine, $PH_3$, was bled into the evacuated deposition chamber. A gas mixing and control system, constructed by Navtek Corp., provided mixing and precise control of gas flow rates. The initial gas flow mixture of silane and phosphine was regulated at 10 cm$^3$/min. The pumping speed was regulated to provide a deposition chamber pressure of about 850 millitorr. A constant current D.C. power supply was connected to the anode and cathode electrode respectively. A potential of about 750 volts was impressed between the anode and cathode electrode, maintaining an anode voltage of about 50 volts with respect to ground and a cathode voltage of about 700 volts with respect to ground. The electric field impressed between the electrodes both decomposed and ionized the gas content of the chamber. After a deposition period of about 1.5 minutes, which deposited a 1500 Å thick phosphine doped layer of N+ amorphous silicon ensuring the ohmicity of the contacting NiCr electrode, the supply of phosphine was removed and pure silane was then fed into the deposition system at a controlled flow rate of about 10 cc/min. The deposition of intrinsic amorphous silicon continued for a period of 15 minutes to deposit an intrinsic layer about 1.5 microns in thickness.

A majority of the substrates were transferred to an ambient excluding chamber, adapted to provide a partial pressure of $SO_2$ in argon, the gaseous $SO_2$ constituting approximately 1% of the gas mixture. The samples were heated to different temperatures for different durations of exposure, illustrated in Table I.

TABLE I

|  | Temperature of Exposure | Duration of Exposure |
|---|---|---|
| Sample A | Control sample - Not exposed | |
| Sample B | 23° C. | ½ hr. |
| Sample C | 23° C. | 2½ hrs. |
| Sample D | 23° C. | 4½ hrs. |
| Sample E | 100° C. | ½ hr. |

Samples B thru E, along with Sample A which represents the unexposed sample, were transferred to a conventional resistance heating vacuum deposition system. A semi-transparent layer of palladium, approximately 100 Angstroms in thickness, was vapor deposited onto the surface of both the intrinsic and treated amorphous silicon layers. Palladium is known to form a Schottky junction to the amorphous silicon.

Figure 2:
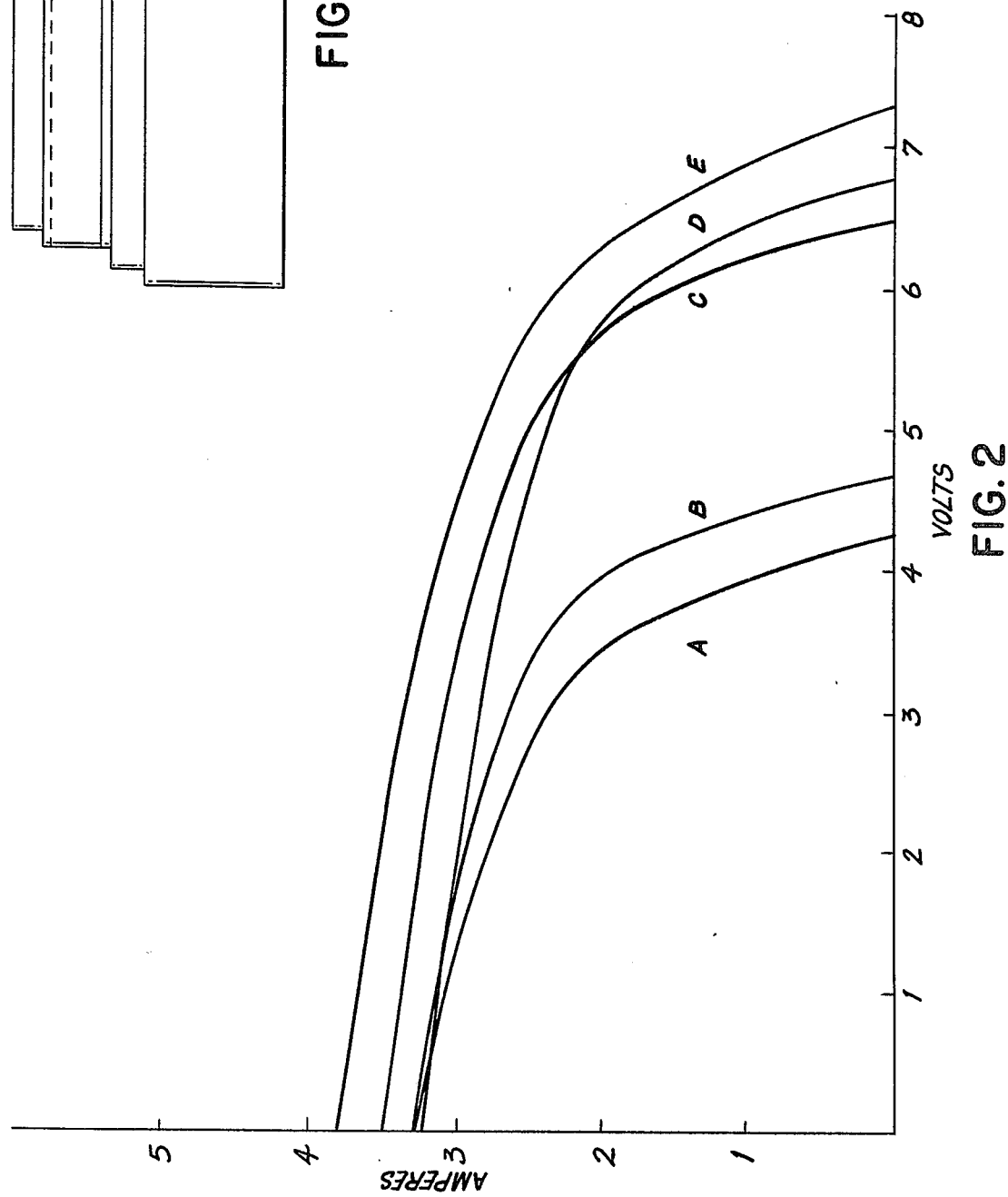
FIG. 2 is a graphic plot of current versus voltage characteristics in normalized but arbitrary units for several photovoltaic devices illustrating the present invention.

Each sample was evaluated by obtaining conventional dark and illuminated current versus voltage characteristics. Illumination was provided by a short arc xenon light source, appropriately filtered to substantially simulate Air Mass One solar spectrum and intensity. As illustrated in FIG. 2, the photovoltaic devices produced in accordance with the present invention exhibited substantially enhanced open circuit photovoltages relative to the conventional amorphous silicon device (Curve A).

The samples were stored in air at room temperature, observing no special precautionary procedures other than avoiding mechanical damage, whereafter a substantial time period the above described experiments were duplicated to reveal that the samples produced according to the present invention displayed little or no detectable change in electrical characteristics.

What is claimed is:

1. An enhanced voltage photovoltaic device having a body of amorphous silicon produced by the process comprising:
   depositing a layer of photoconductive amorphous silicon onto a substrate;
   exposing a surface of said amorphous silicon layer to a gas containing a partial pressure of sulfur dioxide at a temperature ranging from between 23° C. and 300° C.;
   forming a diode junction to said exposed surface.

2. The photovoltaic device of claim 1 wherein said exposing is for a period in excess of about ½ hour and less than about 10 hours.

3. The photovoltaic device of claim 1 wherein said exposing is accomplished at a temperature between 23° C. and 100° C.

4. The photovoltaic device of claim 1 wherein said gas comprises a mixture of $SO_2$ in argon.

5. The photovoltaic device of claim 4 wherein said mixture comprises between about 1% and about 5% $SO_2$ in argon.

6. The photovoltaic device of claim 5 wherein said exposing is accomplished at about 100° C. for a period of about 2 hours.

7. The photovoltaic device of claim 1 wherein said diode junction comprise a Schottky diode junction.

8. A process for increasing both photovoltage and longevity in a photovoltaic device having a body of amorphous silicon, said process comprising first exposing at least one surface of said amorphous silicon to gaseous sulfur dioxide and secondly forming a photovoltaic junction to said exposed amorphous silicon surface.

* * * * *